United States Patent
Moon et al.

(10) Patent No.: US 9,859,351 B2
(45) Date of Patent: Jan. 2, 2018

(54) ORGANIC LIGHT-EMITTING DIODE DISPLAY

(71) Applicant: Samsung Display Co., Ltd., Yongin, Gyeonggi-Do (KR)

(72) Inventors: Sangho Moon, Yongin (KR); Sungho Kim, Yongin (KR); Sangkyung Lee, Yongin (KR)

(73) Assignee: Sansung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/721,446

(22) Filed: May 26, 2015

(65) Prior Publication Data

US 2016/0093679 A1     Mar. 31, 2016

(30) Foreign Application Priority Data

Sep. 30, 2014 (KR) .......................... 10-2014-0132022

(51) Int. Cl.
*H01L 27/32* (2006.01)
*H01L 51/52* (2006.01)
*H01L 51/05* (2006.01)

(52) U.S. Cl.
CPC ........ *H01L 27/326* (2013.01); *H01L 27/3244* (2013.01); *H01L 27/3246* (2013.01); *H01L 51/0512* (2013.01); *H01L 51/5203* (2013.01)

(58) Field of Classification Search
CPC . H01L 27/32; H01L 27/3241; H01L 27/3244; H01L 27/3246; H01L 27/3248; H01L 27/3258; H01L 2227/32; H01L 2251/308; H01L 2251/306; H01L 2251/305; H01L 27/326; H01L 51/5203
See application file for complete search history.

(56) References Cited

U.S. PATENT DOCUMENTS 5,982,467 A * 11/1999 Lee ..................... G02F 1/13458
349/138
7,345,419 B2 * 3/2008 Gotoh ................ H01L 51/0096
313/498

(Continued)

FOREIGN PATENT DOCUMENTS

JP            05158072 A  *  6/1993
KR   10-2011-0080384 A      7/2011

(Continued)

*Primary Examiner* — Olik Chaudhuri
*Assistant Examiner* — Pauline Vu
(74) *Attorney, Agent, or Firm* — Knobbe, Martens, Olson & Bear, LLP (57) ABSTRACT

An organic light-emitting diode display is disclosed. In one aspect, the display includes a substrate and a plurality of pixels formed over the substrate, each pixel including a first region from which light is emitted and a second region through which external light is transmitted. The display also includes a plurality of pixel circuit units each formed in the first region and including at least one thin-film transistor, an inorganic insulating film formed in the second region, a transparent conductive film formed over at least a portion of the inorganic insulating film, and an organic insulating film covering the pixel circuit units and at least a portion of the transparent conductive film. The display further includes a plurality of first electrodes formed over the organic insulating film and in the first regions of the pixels.

23 Claims, 4 Drawing Sheets

(56) References Cited

U.S. PATENT DOCUMENTS

| | | | | |
|---|---|---|---|---|
| 2002/0149054 A1* | 10/2002 | So | H01L 27/12 | 257/347 |
| 2004/0119905 A1* | 6/2004 | Jang | G02F 1/133555 | 349/56 |
| 2004/0183436 A1* | 9/2004 | Ito | H01L 27/3246 | 313/506 |
| 2005/0179374 A1* | 8/2005 | Kwak | H01L 27/3276 | 313/506 |
| 2009/0128023 A1* | 5/2009 | Kwak | H01L 27/3246 | 313/504 |
| 2009/0209068 A1* | 8/2009 | Chang | H01L 27/1248 | 438/158 |
| 2009/0256467 A1* | 10/2009 | Yamazaki | H01L 27/3244 | 313/504 |
| 2009/0295769 A1* | 12/2009 | Yamazaki | H01L 27/14678 | 345/207 |
| 2010/0155578 A1* | 6/2010 | Matsumoto | H01L 27/14632 | 250/216 |
| 2011/0001139 A1* | 1/2011 | Kim | H01L 27/3244 | 257/59 |
| 2011/0114956 A1* | 5/2011 | Park | H01L 27/3248 | 257/59 |
| 2011/0163664 A1 | 7/2011 | Kang et al. | | |
| 2011/0169720 A1 | 7/2011 | Hwang et al. | | |
| 2011/0205198 A1* | 8/2011 | Jeong | H01L 27/326 | 345/205 |
| 2011/0220901 A1* | 9/2011 | Ha | H01L 27/322 | 257/59 |
| 2011/0221661 A1* | 9/2011 | Yoon | H01L 27/3272 | 345/76 |
| 2011/0241014 A1* | 10/2011 | Yoon | H01L 27/3276 | 257/72 |
| 2011/0273409 A1 | 11/2011 | Lee et al. | | |
| 2012/0001182 A1* | 1/2012 | Choi | H01L 27/1255 | 257/59 |
| 2012/0049191 A1* | 3/2012 | You | H01L 27/1214 | 257/59 |
| 2012/0074388 A1* | 3/2012 | Park | H01L 27/3258 | 257/40 |
| 2012/0074414 A1* | 3/2012 | Lee | H01L 27/124 | 257/59 |
| 2012/0091459 A1* | 4/2012 | Choi | H01L 51/5215 | 257/59 |
| 2012/0104396 A1* | 5/2012 | Pyo | H01L 27/124 | 257/59 |
| 2012/0146030 A1* | 6/2012 | You | H01L 27/124 | 257/59 |
| 2012/0169683 A1 | 7/2012 | Hong | | |
| 2012/0267611 A1* | 10/2012 | Chung | H01L 27/3211 | 257/40 |
| 2013/0001564 A1* | 1/2013 | Choi | H01L 27/3276 | 257/59 |
| 2013/0015456 A1* | 1/2013 | You | H01L 29/4908 | 257/71 |
| 2013/0075761 A1* | 3/2013 | Akiyama | H01L 27/288 | 257/80 |
| 2013/0161632 A1* | 6/2013 | You | H01L 27/3276 | 257/72 |
| 2013/0320306 A1* | 12/2013 | Choi | H01L 51/5215 | 257/40 |
| 2013/0320314 A1* | 12/2013 | Kim | H01L 51/52 | 257/40 |
| 2014/0225071 A1* | 8/2014 | Park | H01L 51/5203 | 257/40 |
| 2015/0076476 A1* | 3/2015 | Odaka | H01L 27/3258 | 257/40 |
| 2015/0084008 A1* | 3/2015 | Park | H01L 27/3276 | 257/40 |
| 2015/0097160 A1* | 4/2015 | Kim | H01L 27/326 | 257/40 |
| 2015/0144891 A1* | 5/2015 | Park | H01L 27/3246 | 257/40 |

FOREIGN PATENT DOCUMENTS

| | | |
|---|---|---|
| KR | 10-2011-0081629 A | 7/2011 |
| KR | 10-2011-0123124 A | 11/2011 |
| KR | 10-2012-0079318 A | 7/2012 |

\* cited by examiner

ORGANIC LIGHT-EMITTING DIODE DISPLAY

CROSS-REFERENCE TO RELATED APPLICATIONS

This application claims the benefit of Korean Patent Application No. 10-2014-0132022, filed on Sep. 30, 2014, in the Korean Intellectual Property Office, the disclosure of which is incorporated herein in its entirety by reference.

BACKGROUND

Field

The described technology generally relates to an organic light-emitting diode display.

Description of the Related Technology

An organic light-emitting diode (OLED) display includes a hole injection electrode, an electron injection electrode, and an OLED that includes an organic emission layer formed between the hole injection electrode and the electron injection electrode. OLED displays are self-emissive and emit light as excitons, generated as holes injected from the hole injection electrode and electrons injected from the electron injection electrode, combine in the organic emission layer.

Since OLED displays are self-emissive and do not need a separate light source, they can be driven with a low voltage, be lightweight and thin, and have excellent viewing angle, contrast, and response speed. Thus, applications include personal portable devices, such as MP3 players or mobile phones, TVs, etc.

A see-through OLED display that enables a user to recognize not only an image realized by the see-through OLED display, but also an external background is being studied.

SUMMARY OF CERTAIN INVENTIVE ASPECTS

One inventive aspect is an OLED display that includes: a substrate; a plurality of pixels that are formed on the substrate and each include a first region from which light is emitted and a second region through which external light transmits; a plurality of pixel circuit units that are each formed in the first region of each of the plurality of pixels and each include at least one thin-film transistor; an inorganic insulating film that is formed in the second region of each of the plurality of pixels; a transparent conductive film that is formed on at least a part of the inorganic insulating film; an organic insulating film that covers the plurality of pixel circuit units and covers at least a part of the transparent conductive film; a plurality of first electrodes that are independently formed on the organic insulating film and in the first regions of the plurality of pixels and are electrically connected to the plurality of pixel circuit units; a pixel-defining film that covers at least a part of each of the plurality of first electrodes; a second electrode that faces the plurality of first electrodes, is electrically connected to all of the plurality of pixels, and is formed at least in the first region of each of the plurality of pixels; and an intermediate layer that is formed between the plurality of first electrodes and the second electrode, and includes an organic emission layer.

The transparent conductive film can be formed of indium tin oxide (ITO).

The pixel-defining film can cover at least a part of the transparent conductive film.

The transparent conductive film can entirely cover a top surface of the inorganic insulating film.

The transparent conductive film can include an opening that exposes at least a part of the inorganic insulating film and is formed between the inorganic insulating film and the organic insulating film.

The inorganic insulating film can be a single layer film or a double layer film formed of at least one of $SiO_2$ and $SiN_x$.

The plurality of pixel circuit units can be formed to planarly overlap the plurality of first electrodes.

The second electrode can include at least one transmissive window formed at a location corresponding to the second region of at least one of the plurality of pixels.

The at least one thin-film transistor of each of the plurality of pixel circuit units can include: an active layer that is formed on the substrate; a gate electrode that is formed on the active layer and insulated from the active layer; a gate insulating film that is formed between the active layer and the gate electrode; an interlayer insulating film that is formed on the gate electrode; and a source electrode and a drain electrode, which are formed on the interlayer insulating film and are each electrically connected to the active layer.

The OLED display can further include a pad conductive film that is formed on the source electrode and the drain electrode and is formed of a same material as the transparent conductive film.

The gate insulating film can be formed of a same material as the inorganic insulating film.

The OLED display can further include a gate wire that transmits a signal to the gate electrode, wherein the gate wire can include: a first gate wire formed of a same material as the gate electrode; and a second gate wire covering the first gate wire.

The second gate wire can cover a top surface and end portions of the first gate wire.

Another aspect is an organic light-emitting diode (OLED) display, comprising a substrate and a plurality of pixels formed over the substrate, wherein each pixel comprises a first region from which light is emitted and a second region through which external light is transmitted. The display also comprises a plurality of pixel circuit units each formed in the first region and comprising at least one thin-film transistor (TFT), an inorganic insulating film formed in the second region, a transparent conductive film formed over at least a portion of the inorganic insulating film, and an organic insulating film covering the pixel circuit units and at least a portion of the transparent conductive film. The display further comprises a plurality of first electrodes formed over the organic insulating film and in the first regions of the pixels, wherein the first electrodes are electrically connected to the pixel circuit units, a pixel-defining film covering at least a portion of each of the first electrodes, a second electrode facing the first electrodes and electrically connected to the pixels, wherein the second electrode is formed in the first region, and an intermediate layer formed between the first electrodes and the second electrode comprising an organic emission layer.

In the above display, the transparent conductive film is formed of indium tin oxide (ITO). In the above display, the pixel-defining film covers at least a portion of the transparent conductive film. In the above display, the transparent conductive film covers a top surface of the inorganic insulating film. In the above display, the transparent conductive film has an opening that exposes at least a portion of the inorganic insulating film and is formed between the inorganic insulating film and the organic insulating film.

In the above display, the inorganic insulating film includes a single layer film or a double layer film formed of at least one of $SiO_2$ and $SiN_x$. In the above display, the pixel circuit units at least partially overlap the first electrodes in the depth dimension of the display. In the above display, the second electrode comprises at least one transmission window formed over the second region of at least one of the pixels.

In the above display, the at least one TFT comprises an active layer formed over the substrate, a gate electrode formed over and insulated from the active layer, a gate insulating film formed between the active layer and the gate electrode, an interlayer insulating film formed over the gate electrode, and source and drain electrodes formed over the interlayer insulating film and electrically connected to the active layer.

The above display further comprises a pad conductive film formed over the source and drain electrodes and formed of the same material as the transparent conductive film.

In the above display, the gate insulating film is formed of the same material as the inorganic insulating film.

The above display further comprises a gate wire configured to transmit a signal to the gate electrode, wherein the gate wire comprises a first gate wire formed of the same material as the gate electrode and a second gate wire covering the first gate wire.

In the above display, the second gate wire covers a top surface and end portions of the first gate wire.

Another aspect is organic light-emitting diode (OLED) display comprising a plurality of pixels each comprising a light emission region and a light transmission region formed adjacent to each other, at least one thin-film transistor (TFT) formed in the light emission region, and an inorganic insulating film formed in the light transmission region. The display also comprises a transparent conductive film formed over at least a portion of the inorganic insulating film, an organic insulating film at least partially covering the TFT and having a first opening so as to at least partially expose the transparent conductive film, a first electrode formed over the organic insulating film and electrically connected to the TFT and a pixel-defining film at least partially covering the first electrode and having a second opening so as to expose the transparent conductive film. The display further comprises a second electrode formed over the first electrode and electrically connected to the pixel, wherein the second electrode is formed in the light emission region, and wherein at least one edge of the transparent conductive film is covered by the organic insulating film and the pixel-defining film.

In the above display, the transparent conductive film is formed of indium tin oxide (ITO).

In the above display, the transparent conductive film covers a top surface of the inorganic insulating film.

In the above display, the transparent conductive film comprises a third opening exposing at least a portion of the inorganic insulating film, wherein the transparent conductive film is formed between the inorganic insulating film and the organic insulating film.

The above display further comprises a pad conductive film, wherein the TFT comprises an active layer formed over the substrate, a gate electrode formed over and insulated from the active layer, a gate insulating film formed between the active layer and the gate electrode, an interlayer insulating film formed over the gate electrode, and source and drain electrodes formed over the interlayer insulating film and electrically connected to the active layer, wherein the pad conductive layer is formed over the source and drain electrodes and formed of the same material as the transparent conductive film.

In the above display, the gate insulating film is formed of the same material as the inorganic insulating film.

The above display further comprises a gate wire configured to transmit a signal to the gate electrode, wherein the gate wire comprises a first gate wire formed of the same material as the gate electrode and a second gate wire at least partially covering a top surface and end portions of the first gate wire.

DETAILED DESCRIPTION OF CERTAIN INVENTIVE EMBODIMENTS

Reference will now be made in detail to embodiments, examples of which are illustrated in the accompanying drawings. In this regard, the present embodiments can have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

It will be understood that although the terms "first", "second", etc. can be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of" when preceding a list of elements, modify the entire list of elements and do not modify the individual elements of the list.

Hereinafter, one or more exemplary embodiments will be described in detail with reference to accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
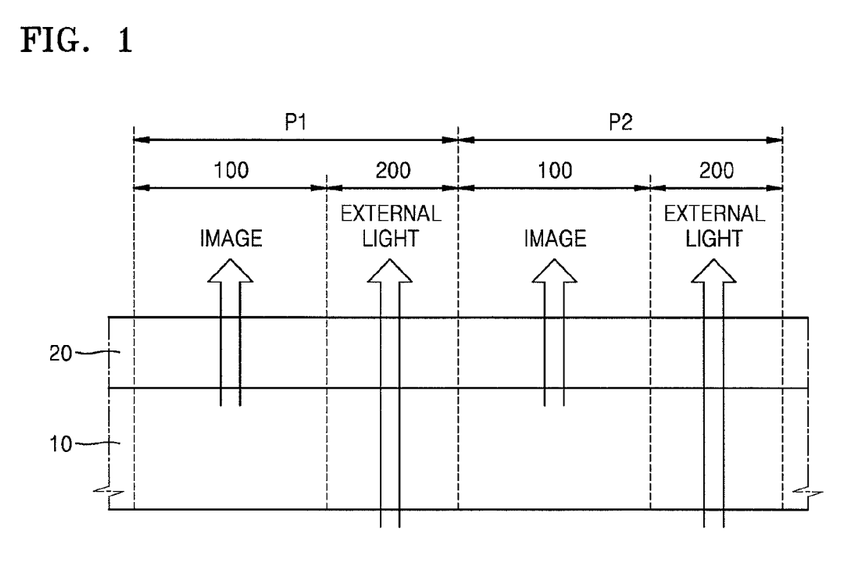
FIG. 1 is a schematic cross-sectional view of an OLED display according to an exemplary embodiment.

FIG. 1 is a schematic cross-sectional view of an OLED display according to an exemplary embodiment.

Referring to FIG. 1, the OLED display according to an exemplary embodiment includes a substrate 10 and a display unit 20 formed on the substrate 10. The OLED display includes a plurality of pixels each including a first region 100 from which light is emitted and a second region 200 through which external light is transmitted. The external light which is incident on the OLED display propagate toward a user after passing through the substrate 10 and the display unit 20.

The display unit 20 is light-transmissive as will be described below, and a user located at a side where an image is realized can observe an image outside the substrate 10. In FIG. 1, the OLED display is a top emission type wherein an image of the display unit 20 is realized in a direction opposite to the substrate 10, but a type of the OLED display is not limited thereto. In some embodiments, the OLED display is a bottom emission type where an image of the display unit 20 is realized in a direction of the substrate 10, or a dual type where an image of the display unit 20 is realized in a direction of the substrate 10 and in a direction opposite to the substrate 10.

In FIG. 1, a first pixel P1 and a second pixel P2, which are adjacent to each other, in the OLED display are shown. Each of the first and second pixels P1 and P2 includes the first region 100 and the second region 200; an image is displayed by the display unit 20 in the first region 100 and external light passes through the second region 200.

For example, since each pixel of the OLED display includes the first region 100 and the second region 200, the user views an image realized by the display unit 20 and/or an external background image through the OLED display.

By not forming a thin-film transistor (TFT), a capacitor, and an OLED in the second region 200, external light transmittance of the second region 200 can be increased. As a result, total external light transmittance of the OLED display can be increased. In addition, distortion of the external background image, which can occur due to interference by the TFT, the capacitor, or the OLED, can be prevented.

Figure 2:
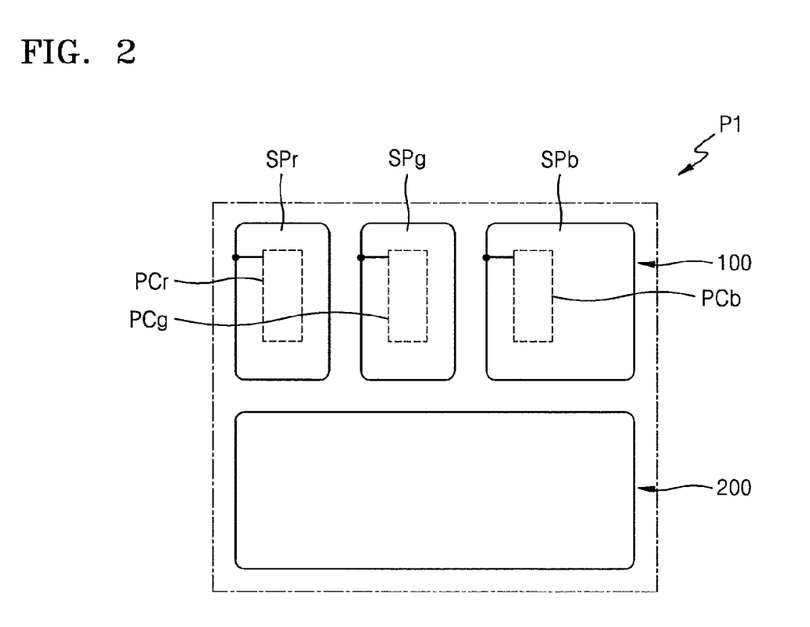
FIG. 2 is a schematic plan view of a pixel included in the OLED display of FIG. 1, according to an exemplary embodiment.

FIG. 2 is a schematic plan view of the first pixel P1 included in the OLED display of FIG. 1, according to an exemplary embodiment.

Referring to FIG. 2, the first pixel P1 included in the display unit 20 of FIG. 1 includes the first and second regions 100 and 200. In some embodiments, the OLED display can be realized as a transparent display.

A first sub-pixel SPr, a second sub-pixel SPg, and a third sub-pixel SPb emit different colored lights and can be arranged in the first region 100. The first sub-pixel SPr, the second sub-pixel SPg, and the third sub-pixel SPb can respectively emit red light, green light, and blue light. However, an embodiment is not limited thereto and any color combination is possible as long as white light is emitted.

The first to third sub-pixels SPr, SPg, and SPb can be respectively driven by a first pixel circuit unit PCr, a second pixel circuit unit PCg, and a third pixel circuit unit PCb.

Figure 3:
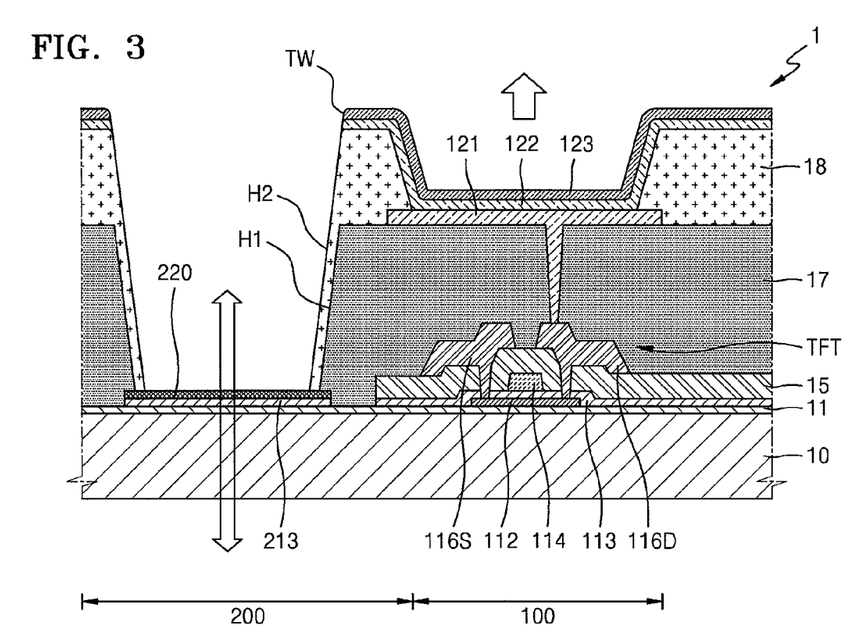
FIG. 3 is a schematic cross-sectional view of a portion of a pixel included in an OLED display, according to an exemplary embodiment.

The first to third pixel circuit units PCr, PCg, and PCb can be arranged to planarly overlap a first electrode 121 of FIG. 3 included in each of the first to third sub-pixels SPr, SPg, and SPb.

Such a structure is suitable to a top emission type OLED display, wherein the first electrode 121 is a reflective electrode and a second electrode 123 of FIG. 3 is a transparent or semi-transparent electrode. By forming the first to third pixel circuit units PCr, PCg, and PCb between the substrate 10 and the first electrode 121, a separate space for forming the first to third pixel circuit units PCr, PCg, and PCb are not be required, thereby increasing an aperture ratio.

However, an embodiment is not limited thereto, and an OLED display according to another embodiment can be a bottom emission type, wherein a first electrode is a transparent or semi-transparent electrode and a second electrode is a reflective electrode. In this case, a pixel circuit unit does not planarly overlap the first electrode such that a path of emitted light is not interfered.

A device that includes an opaque material, such as a reflective electrode or a wire, is not formed in the second region 200, and only a transparent insulating film can be formed in the second region 200. The second region 200 can be defined by an opaque wire that is formed on a boundary of the first pixel P1.

FIG. 3 is a schematic cross-sectional view of a portion of a pixel included in an OLED display 1, according to an exemplary embodiment.

Referring to FIG. 3, the OLED display 1 according to an embodiment includes the substrate 10 and a plurality of pixels (for example, the first and second pixels P1 and P2 of FIG. 1) that are formed on the substrate 10. Each pixel includes the first region 100 and the second region 200. The OLED display 1 includes a plurality of pixel circuit units (for example, the first pixel circuit unit PCr, the second pixel circuit unit PCg, and the third pixel circuit unit PCb of FIG. 2) that are formed in the first region 100 of each pixel, each pixel circuit unit including at least one TFT. The OLED display 1 also includes an inorganic insulating film 213 formed in the second region 200 of each pixel, and a transparent conductive film 220 formed on at least a portion of the inorganic insulating film 213. The OLED display 1 further includes an organic insulating film 17 that covers the pixel circuit units and at least a portion of the transparent conductive film 220. The OLED display 1 additionally includes a plurality of the first electrodes 121 that are i) independently formed on the organic insulating film 17 and in the first regions 100 of the pixels and ii) electrically connected to the pixel circuit units. The OLED display 1 also includes a pixel-defining film 18 that covers at least a portion of the first electrode 121 and the second electrode 123. The second electrode 123 faces the first electrodes 121, is electrically connected to all of the pixels, and is formed on at least the first region 100 of each pixel. The OLED display 1 includes an intermediate layer 122 formed between the first electrode 121 and the second electrode 123, the intermediate layer 122 including an organic emission layer.

The substrate 10 is formed of glass or plastic, and a buffer layer 11 can be formed on the substrate 10. The buffer layer 11 can prevent impure elements from penetrating through the substrate 10. The buffer layer 11 also flattens a surface of the substrate 10 and can be a single layer or a multi-layer formed of an inorganic material, such as silicon nitride ($SiN_x$) and/or silicon oxide ($SiO_x$).

The TFT is formed on the buffer layer 11 in the first region 100. The TFT includes an active layer 112, a gate electrode 114 that is insulated from the active layer 112, a source electrode 116S, and a drain electrode 116D The source and drain electrodes 116S and 116D are electrically connected to the active layer 112, respectively, wherein a gate insulating film 113 is formed between the active layer 112 and the gate electrode 114. An interlayer insulating film 115 can be formed between the gate electrode 114 and the source and drain electrodes 116S and 116D.

The gate insulating film 113 can be a single film formed of $SiO_2$, and the interlayer insulating film 115 can be a single layer or a multilayer formed of $SiO_2$ and/or $SiN_x$.

The TFT is a top gate type wherein the gate electrode 114 is formed on the active layer 112, but an embodiment is not limited thereto, and the gate electrode 114 can be formed below the active layer 112.

The active layer 112 can be formed of various materials. For example, the active layer 112 can be formed of an inorganic semiconductor material, such as amorphous silicon or crystalline silicon. Alternatively, the active layer 112 be formed of an oxide semiconductor or an organic semiconductor material.

The gate electrode 114 can be a single layer or a multilayer formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 114 can, for example, be three layers of Mo/Al/Mo or Ti/Al/Ti.

The source and drain electrodes 116S and 116D can each be at least two layers of a metal layer formed of a material selected from Al, Pt, Pd, Ag, Mg, Au, Ni, Nd, Ir, Cr, Li, Ca, Mo, Ti, W, Cu, and an alloy thereof.

The organic insulating film 17 can be formed on the interlayer insulating film 115 to cover the source and drain electrodes 116S and 116D. The first electrode 121 electrically connected to the drain electrode 116D, the second electrode 123 facing the first electrode 121, and the intermediate layer 122 formed between the first and second electrodes 121 and 123 and including the organic emission layer that emits light can be formed on the organic insulating film 17.

Two edges of the first electrode 121 can be covered by the pixel-defining film 18. The organic insulating film 17 and the pixel-defining film 18 can each be formed of an organic material, such as polyimide (PI). The organic insulating film 17 can cover components, such as the TFT, for planarization, and the pixel-defining film 18 can define the first region 100, i.e., an emission region. The pixel-defining film 18 can prevent an electric field from concentrating at an edge of the first electrode 121 and the first and second electrodes 121 and 123 from being short-circuited.

The first electrode 121 can be a reflective electrode, and can include a reflective layer formed of Ag, mg, Al, Pt, Pd, Au, Ni, Nd, Ir, Cr, or a compound thereof, and a transparent or semi-transparent electrode layer formed on the reflective layer. The first electrodes 121 can have independent island shapes according to sub-pixels.

The second electrode 123 can be a transparent or semi-transparent electrode, be formed of at least one material among Ag, Al, Mg, Li, Ca, Cu, LiF/Ca, LiF/Al, MgAg, and CaAg, and be formed as a thin-film having a thickness of several dozens of nm. The second electrode 123 can be electrically connected to all pixels included in the OLED display 1.

The intermediate layer 122 can be formed between the first and second electrodes 121 and 123. The intermediate layer 122 can include an organic emission layer that emits light, and can further include at least one of a hole injection layer (HIL), a hole transport layer (HTL), an electron transport layer (ETL), and an electron injection layer (EIL). However, an embodiment is not limited thereto, and various functional layers can be further formed between the first and second electrodes 121 and 123.

The organic emission layer can emit red light, green light, or blue light. However, an embodiment is not limited thereto, and the organic emission layer can emit white light. In this case, the organic emission layer has a structure in which a light-emitting material emitting red light, a light-emitting material emitting green light, and a light-emitting material emitting blue light are stacked on one another, or a structure in which the light-emitting materials are mixed.

The red, greed, and blue colors are exemplary and an embodiment is not limited thereto. For example, any combination of other various colors, which can emit white light, is employed in addition to a combination of red, green, and blue colors.

The OLED display 1 according to an embodiment can be a top emission type that realizes an image in a direction of the second electrode 123, and the pixel circuit units can be formed between the substrate 10 and the first electrode 121.

The inorganic insulating film 213 can be formed on the buffer layer 11 in the second region 20, and the transparent conductive film 220 can be formed on the inorganic insulating film 213.

The transparent conductive film 220 covers a top surface of the inorganic insulating film 213, and can operate as an etch stop film that prevents the inorganic insulating film 213 from being etched during an etch process of removing an interlayer insulating film 15 formed in the second region 200. The transparent conductive film 220 can be formed of a transparent conductive material, such as indium tin oxide (ITO).

The inorganic insulating film 213 can be a single layer formed of $SiO_2$, and can be formed of the same material as the gate insulating film 113. In some embodiments, the inorganic insulating film 213 is formed via the same process as the gate insulating film 113. In the OLED display 1 according to an embodiment, by forming the inorganic insulating film 213 formed in the second region 200 through which external light penetrates to be a single film, interface reflection that occurs at an interface between films having different refractive indexes is reduced, and thus transmittance of the OLED display 1 increases.

An edge of the transparent conductive film 220 can be covered by the organic insulating film 17 and the pixel-defining film 18, which extend from the first region 100. The organic insulating film 17 and the pixel-defining film 18 can be formed of an organic material, and can respectively include a first opening H1 and a second opening H2, which expose a portion of the transparent conductive film 220. A width of the first opening H1 can be larger than a width of the second opening H2. By forming the first opening H1 and the second opening H2 respectively in the organic insulating film 17 and the pixel-defining film 18, transmittance of the second region 200 can increase.

The edge of the transparent conductive film 220 covered by the organic insulating film 17 and the pixel-defining film 18 can be formed between the inorganic insulating film 213, the organic insulating film 17, and the pixel-defining film 18. If the transparent conductive film 220 is not used, a detaching phenomenon can occur between the inorganic insulating film 213, the organic insulating film 17, and the pixel-defining film 18.

However, in the OLED display 1 according to an embodiment, the transparent conductive film 220 is formed between the inorganic insulating film 213, the organic insulating film 17, and the pixel-defining film 18 to increase adhesion therebetween, thereby preventing the detaching phenomenon.

The intermediate layer 122 and the second electrode 123 formed in the first region 100 can extend up to a top surface of the pixel-defining film 18, and the second electrode 123 can include a transmission window TW formed at a location corresponding to the second region 200.

In some embodiments, the intermediate layer 122 and the second electrode 123 are not formed in the second opening H2 of the pixel-defining film 18, and accordingly, the transmittance of the second region 200 further increases.

FIGS. 4 through 7 are schematic cross-sectional views of a portion of a pixel included in each of OLED displays 2 through 5 according to exemplary embodiments.

Figure 4:
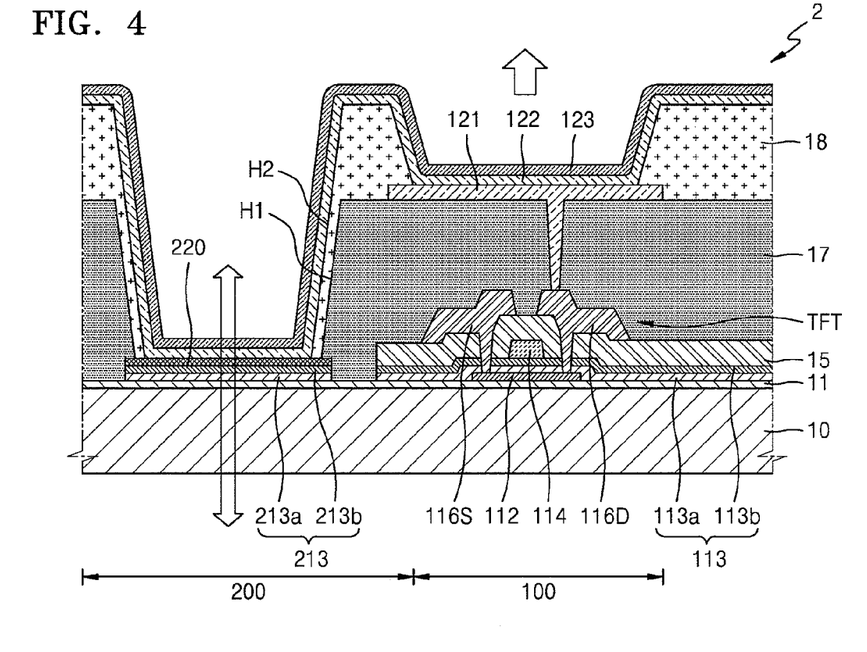
FIGS. 4 through 7 are schematic cross-sectional views of a portion of a pixel included in each of OLED displays according to exemplary embodiments.

Referring to FIG. 4, the OLED display 2 according to an embodiment includes the buffer layer 11 formed on the substrate 10. The OLED display 2 also includes the inorganic insulating film 213 and the transparent conductive film 220 formed on the buffer layer 11 in the second region 200.

The transparent conductive film 220 can cover the top surface of the inorganic insulating film 213, and can operate as an etch stop film that prevents the inorganic insulating film 213 from being etched during the etching process of removing the interlayer insulating film 15 formed in the second region 200. The transparent conductive film 220 can be formed of a transparent conductive material, such as ITO.

The inorganic insulating film 213 can include a double film including a first layer 213a formed of $SiO_2$ and a second layer 213b formed of $SiN_x$, and can be formed of the same material as the gate insulating film 113. In some embodiments, the gate insulating film 113 is also a double film including a first layer 113a formed of $SiO_2$ and a second layer 113b formed of $SiN_x$, and the inorganic insulating film 213 and the gate insulating film 113 can be formed via the same process.

The edge of the transparent conductive film 220 can be sequentially covered by the organic insulating film 17 and the pixel-defining film 18 extending from the first region 100. The organic insulating film 17 and the pixel-defining film 18 can each be formed of an organic material, and can respectively include the first opening H1 and the second opening H2, which expose the portion of the transparent conductive film 220. The width of the first opening H1 can be larger than the width of the second opening H2, and by forming the first and second openings H1 and H2 respectively in the organic insulating film 17 and the pixel-defining film 18, the transmittance of the second region 200 can increase.

The edge of the transparent conductive film 220 covered by the organic insulating film 17 and the pixel-defining film 18, can be formed between the inorganic insulating film 213, the organic insulating film 17, and the pixel-defining film 18. If the transparent conductive film 220 is not used, the detaching phenomenon can occur between the inorganic insulating film 213, the organic insulating film 17, and the pixel-defining film 18.

However, in the OLED display 2 according to an embodiment, the transparent conductive film 220 is formed between the inorganic insulating film 213, the organic insulating film 17, and the pixel-defining film 18 to increase adhesion therebetween, thereby preventing the detaching phenomenon.

The intermediate layer 122 and the second electrode 123 formed in the first region 100 can extend up to a top surface of the transparent conductive film 220 along a top surface of the pixel-defining film 18 and the second opening H2 of the pixel-defining film 18.

Since the intermediate layer 122 and the second electrode 123 are formed of a material having high transmittance, even if the intermediate layer 122 and the second electrode 123 are formed in the second region 200, an external background image can still be viewable through the OLED display 2.

Accordingly, transmittance of the OLED display 2 can be slightly lower than that of the OLED display 1 of FIG. 3, but manufacturing costs of the OLED display 2 can be lower since the intermediate layer 122 and the second electrode 123 can be easily deposited.

Since other components of the OLED display 2 are the same as those of the OLED display 1 of FIG. 3, details thereof are not repeated.

Figure 5:
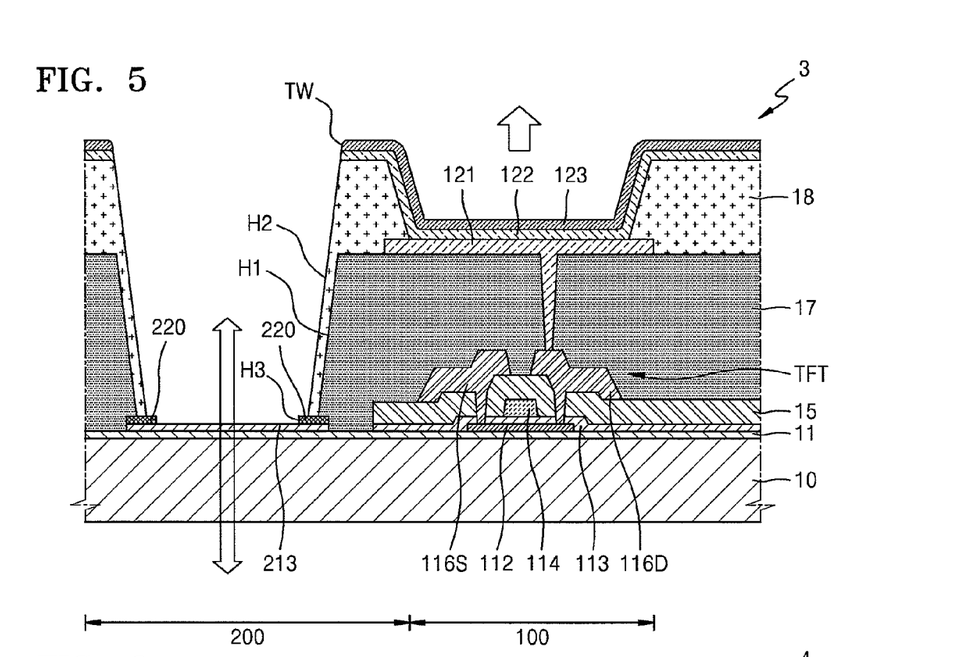

Referring to FIG. 5, the OLED display 3 according to an embodiment can include the buffer layer 11 formed on the substrate 10, and the inorganic insulating film 213 and the transparent conductive film 220 formed on the buffer layer 11 in the second region 200.

The transparent conductive film 220 includes a third opening H3 exposing a portion of the inorganic insulating film 213, and can be formed to cover only an edge of the inorganic insulating film 213. The transparent conductive film 220 can be formed of a transparent conductive material, such as ITO.

The inorganic insulating film 213 can be a single film formed of $SiO_2$, and can be formed of the same material as the gate insulating film 113. In some embodiments, the inorganic insulating film 213 and the gate insulating film 113 are formed via the same process.

The transparent conductive film 220 can be covered by the organic insulating film 17 and the pixel-defining film 18, which extend from the first region 100. The organic insulating film 17 and the pixel-defining film 18 can each be formed of an organic material, and can respectively include the first opening H1 and the second opening H2, which expose the portion of the transparent conductive film 220. The width of the first opening H1 can be larger than the width of the second opening H2, and by respectively forming the first opening H1 and the second opening H2 in the organic insulating film 17 and the pixel-defining film 18, the transmittance of the second region 200 can increase.

The transparent conductive film 220 including the third opening H3 can be formed between the inorganic insulating film 213, the organic insulating film 17, and the pixel-defining film 18. If the transparent conductive film 220 is not used, the detaching phenomenon can occur between the inorganic insulating film 213, the organic insulating film 17, and the pixel-defining film 18.

However, in the OLED display 3 according to an embodiment, the transparent conductive film 220 is formed between the inorganic insulating film 213, the organic insulating film 17, and the pixel-defining film 18 to increase adhesion therebetween, thereby preventing the detaching phenomenon. Also, since the transparent conductive film 220 includes the third opening H3 exposing the portion of the inorganic insulating film 213, the transmittance of the second region 200 can further increase.

Since other components of the OLED display 3 are the same as those of the OLED display 1 of FIG. 3, details thereof are not repeated.

Figure 6:
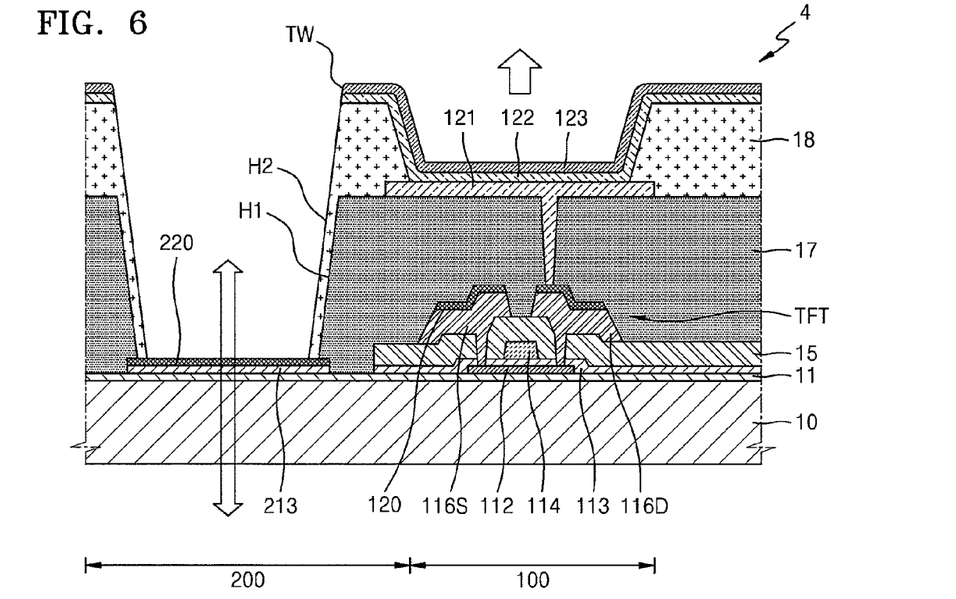

Referring to FIG. 6, the OLED display 4 according to an embodiment includes the buffer layer 11 formed on the substrate 10, and the TFT formed in the first region 100 on the buffer layer 11.

The TFT includes the active layer 112, the gate electrode 114 that is insulated from the active layer 112, and the source and drain electrodes 116S and 116D that are electrically connected to the active layer 112, respectively. The gate insulating film 113 can be formed between the active layer 112 and the gate electrode 114, and the interlayer insulating film 115 can be formed between the gate electrode 114 and the source and drain electrodes 116S and 116D.

The gate insulating film 113 can be a single film formed of $SiO_2$, and the interlayer insulating film 115 can be a single film or a plurality of layers formed of $SiO_2$ and/or $SiN_x$.

A pad conductive film 120 can be formed on the source and drain electrodes 116S and 116D, and can be formed of the same material as the transparent conductive film 220, i.e., a transparent conductive material, such as ITO.

Although not shown in FIG. 6, a data pad unit (not shown) can include a data electrode (not shown) formed of the same material and on the same layer as the source and drain electrodes 116S and 116D. Also, a passivation layer (not shown) can be formed on the data electrode so as to prevent the data electrode from being damaged by being externally exposed.

The passivation layer can be formed of a transparent conductive material, such as ITO, and the transparent conductive film 220 and the pad conductive film 120 can be formed via the same process and of the same material as the passivation layer.

Here, the pad conductive film 120 can be patterned by using one mask together with the source and drain electrodes 116S and 116D, and thus a number of masks is not increased.

Since other components of the OLED display 4 are the same as those of the OLED display 1 of FIG. 3, details thereof are not repeated.

Figure 7:
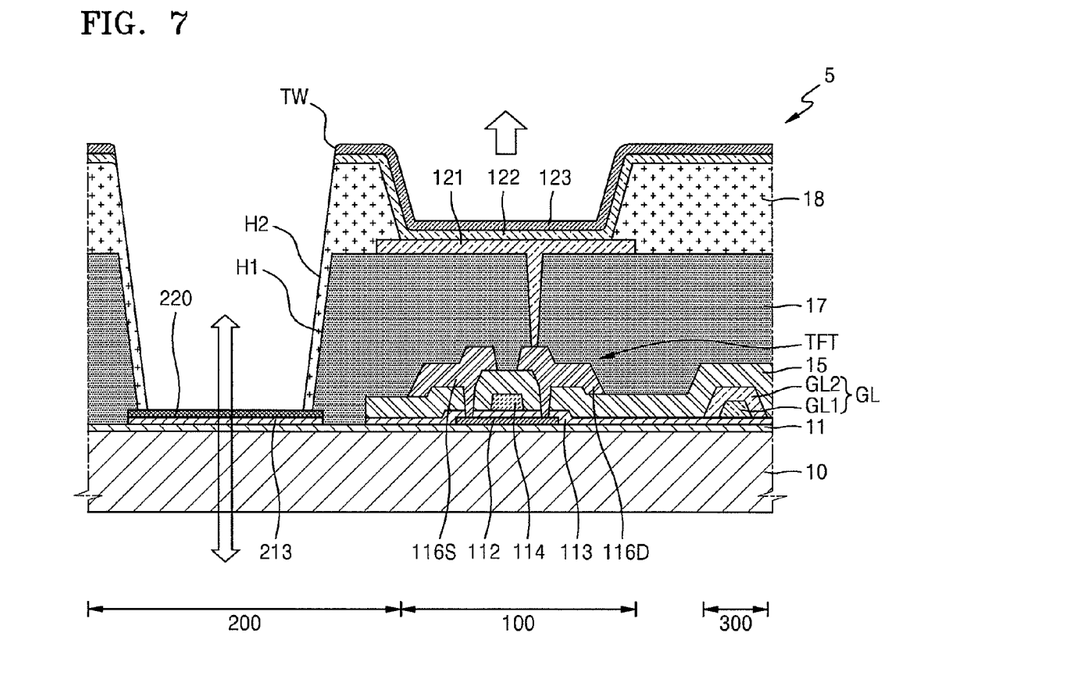

Referring to FIG. 7, the OLED display 5 according to an embodiment further includes a gate wire GL that is formed in a third region 300 on the buffer layer 11 and transmits a signal to the gate electrode 114, from the OLED display 1 of FIG. 3. The gate wire GL can include a first gate wire GL1 formed of the same material as the gate electrode 114, and a second gate wire GL2 covering the first gate wire GL1.

The first and second gate wires GL1 and GL2 can each be a single layer or a multilayer formed of at least one material from among Al, Pt, Pd, Ag, Mg, Au, Ni, Nd, Ir, Cr, Li, Ca, Mo, Ti, W, and Cu, and for example, can each include three layers of Mo/Al/Mo or Ti/Al/Ti.

A thickness of the first gate wire GL1 can be less than a thickness of the second gate wire GL2. The gate wire GL transmits signal and can have a thickness that is substantially greater than or equal to a given thickness for low resistance. Also, the gate electrode 114 is thin such that the interlayer insulating film 15 is formed to be stable.

Accordingly, by forming the gate wire GL to have two layers, i.e., the first gate wire GL1 formed via the same process and of the same material as the gate electrode 114, and the second gate wire GL2 covering the first gate wire GL1, low resistance of the gate wire GL can be realized.

The second gate wire GL2 can be formed to cover a top surface and end portions of the first gate wire GL1.

Since other components of the OLED display 5 are the same as those of the OLED display 1 of FIG. 3, details thereof are not repeated.

As described above, according to one or more exemplary embodiments, the adhesion between the inorganic insulating film 213, the organic insulating film 17, and the pixel-defining film 18, which are formed in the second region 200, can be increased. Therefore, the OLED displays 1 through 5 having increased transmittance can be realized.

As described above, according to one or more exemplary embodiments, a see-through OLED display having improved transmittance is realized.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display, comprising:
    a substrate;
    a plurality of pixels formed over the substrate, wherein each pixel comprises a first region from which light is emitted and a second region through which external light is transmitted;
    a plurality of pixel circuit units each formed in the first region and comprising at least one thin-film transistor (TFT);
    an inorganic insulating film formed in the second region;
    a transparent conductive film formed over at least a portion of the inorganic insulating film;
    an organic insulating film covering the plurality of pixel circuit units and at least a portion of the transparent conductive film;
    a plurality of first electrodes formed over the organic insulating film and in the first region of the plurality of pixels, wherein the plurality of first electrodes are electrically connected to the plurality of pixel circuit units;
    a pixel-defining film covering at least a portion of each of the plurality of first electrodes;
    a second electrode facing the plurality of first electrodes and electrically connected to the plurality of pixels, wherein the second electrode is formed in the first region; and
    an intermediate layer formed between the plurality of first electrodes and the second electrode comprising an organic emission layer, wherein the transparent conductive film is separated from the plurality of first electrodes and the second electrode, and wherein the transparent conductive film does not overlap the plurality of first electrodes and the second electrode in a depth dimension of the OLED display.

2. The OLED display of claim 1, wherein the transparent conductive film is formed of indium tin oxide (ITO).

3. The OLED display of claim 1, wherein the pixel-defining film covers at least a portion of the transparent conductive film.

4. The OLED display of claim 1, wherein the transparent conductive film covers a top surface of the inorganic insulating film.

5. The OLED display of claim 1, wherein the transparent conductive film has an opening that exposes at least another portion of the inorganic insulating film and is formed between the inorganic insulating film and the organic insulating film.

6. The OLED display of claim 1, wherein the inorganic insulating film includes a single layer film or a double layer film formed of at least one of $SiO_2$ and $SiN_x$.

7. The OLED display of claim 1, wherein the plurality of pixel circuit units at least partially overlap the plurality of first electrodes in the depth dimension of the OLED display.

8. The OLED display of claim 1, wherein the second electrode comprises at least one transmission window formed over the second region of at least one of the plurality of pixels.

9. The OLED display of claim 1, wherein the at least one TFT comprises:
an active layer formed over the substrate;
a gate electrode formed over and insulated from the active layer;
a gate insulating film formed between the active layer and the gate electrode;
an interlayer insulating film formed over the gate electrode; and
source and drain electrodes formed over the interlayer insulating film and electrically connected to the active layer.

10. The OLED display of claim 9, further comprising a pad conductive film formed over the source and drain electrodes and formed of same material as the transparent conductive film.

11. The OLED display of claim 9, wherein the gate insulating film is formed of same material as the inorganic insulating film.

12. The OLED display of claim 9, further comprising a gate wire configured to transmit a signal to the gate electrode, wherein the gate wire comprises:
a first gate wire formed of same material as the gate electrode; and
a second gate wire covering the first gate wire.

13. The OLED display of claim 12, wherein the second gate wire covers a top surface and end portions of the first gate wire.

14. An organic light-emitting diode (OLED) display, comprising:
a plurality of pixels each comprising a light emission region and a light transmission region formed adjacent to each other;
at least one thin-film transistor (TFT) formed in the light emission region;
an inorganic insulating film formed in the light transmission region;
a transparent conductive film formed over at least a portion of the inorganic insulating film;
an organic insulating film at least partially covering the TFT and having a first opening so as to at least partially expose the transparent conductive film;
a first electrode formed over the organic insulating film and electrically connected to the TFT;
a pixel-defining film at least partially covering the first electrode and having a second opening so as to expose the transparent conductive film; and
a second electrode formed over the first electrode and electrically connected to each of the plurality of pixels, wherein the second electrode is formed in the light emission region, wherein at least one edge of the transparent conductive film is covered by the organic insulating film and the pixel-defining film, wherein the transparent conductive film is separated from the first electrode and the second electrode, and wherein a transparent conductive film does not overlap the first and second electrodes in a depth dimension of the OLED display.

15. The OLED display of claim 14, wherein the transparent conductive film is formed of indium tin oxide (ITO).

16. The OLED display of claim 14, wherein the transparent conductive film covers a top surface of the inorganic insulating film.

17. The OLED display of claim 14, wherein the transparent conductive film comprises a third opening exposing at least a portion of the inorganic insulating film, and wherein the transparent conductive film is formed between the inorganic insulating film and the organic insulating film.

18. The OLED display of claim 14, further comprising a pad conductive film, wherein the TFT comprises:
an active layer formed over a substrate;
a gate electrode formed over and insulated from the active layer;
a gate insulating film formed between the active layer and the gate electrode;
an interlayer insulating film formed over the gate electrode; and
source and drain electrodes formed over the interlayer insulating film and electrically connected to the active layer, wherein the pad conductive film is formed over the source and drain electrodes and formed of same material as the transparent conductive film.

19. The OLED display of claim 18, wherein the gate insulating film is formed of same material as the inorganic insulating film.

20. The OLED display of claim 19, further comprising a gate wire configured to transmit a signal to the gate electrode, wherein the gate wire comprises:
a first gate wire formed of same material as the gate electrode; and
a second gate wire at least partially covering a top surface and end portions of the first gate wire.

21. The OLED display of claim 1, wherein the transparent conductive film does not overlap the intermediate layer in the depth dimension of the OLED display.

22. The OLED display of claim 1, wherein the organic insulating film contacts only a side portion of the transparent conductive film.

23. The OLED display of claim 1, wherein the transparent conductive film has an end portion that is surrounded by the organic and inorganic insulating films.

* * * * *